US010957686B2

(12) United States Patent
Ahlers et al.

(10) Patent No.: US 10,957,686 B2
(45) Date of Patent: *Mar. 23, 2021

(54) SEMICONDUCTOR DEVICE INCLUDING AN INTEGRATED RESISTOR AND METHOD OF PRODUCING THEREOF

(71) Applicant: Infineon Technologies AG, Neubiberg (DE)

(72) Inventors: Dirk Ahlers, Munich (DE); Markus Zundel, Egmating (DE); Peter Brandl, Finkenstein (AT); Kurt Matoy, Strau (AT); Thomas Ostermann, Velden am Woerthersee (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/744,693

(22) Filed: Jan. 16, 2020

(65) Prior Publication Data

US 2020/0152621 A1 May 14, 2020

Related U.S. Application Data

(63) Continuation of application No. 16/236,741, filed on Dec. 31, 2018, now Pat. No. 10,586,792, which is a (Continued)

(30) Foreign Application Priority Data

Oct. 25, 2016 (DE) .......................... 10 2016 120 292

(51) Int. Cl.
*H01L 27/02* (2006.01)
*H01L 29/78* (2006.01)
(Continued)

(52) U.S. Cl.
CPC ...... *H01L 27/0292* (2013.01); *H01L 27/0255* (2013.01); *H01L 27/0288* (2013.01); (Continued)

(58) Field of Classification Search
None
See application file for complete search history.

(56) References Cited

U.S. PATENT DOCUMENTS 9,379,207 B2 6/2016 Breil
10,586,792 B2 * 3/2020 Ahlers ................ H01L 27/0296
(Continued)

FOREIGN PATENT DOCUMENTS

DE 112007002258 T5 7/2009
JP 2005123340 A 5/2005

*Primary Examiner* — Dung A. Le
(74) *Attorney, Agent, or Firm* — Murphy, Bilak & Homiller, PLLC

(57) ABSTRACT

A semiconductor device of an embodiment includes a transistor device in a semiconductor die including a semiconductor body. The transistor device includes transistor cells connected in parallel and covering at least 80% of an overall active area at a first surface of the semiconductor body. The semiconductor device further includes a control terminal contact area at the first surface electrically connected to a control electrode of each of the transistor cells. A first load terminal contact area at the first surface electrically connected to a first load terminal region of each of the transistor cells. The semiconductor device further includes a resistor in the semiconductor die and electrically coupled between the control terminal contact area and the first load terminal contact area, and a pn junction diode electrically connected in series with the resistor. A method of producing the semiconductor device is also described.

20 Claims, 6 Drawing Sheets

Related U.S. Application Data continuation of application No. 15/792,492, filed on Oct. 24, 2017, now Pat. No. 10,186,508.

(51) Int. Cl.
| | |
|---|---|
| *H01L 29/06* | (2006.01) |
| *H01L 29/786* | (2006.01) |
| *H01L 29/40* | (2006.01) |
| *H01L 49/02* | (2006.01) |
| *H01L 29/739* | (2006.01) |
| *H01L 29/808* | (2006.01) |

(52) U.S. Cl.
CPC ...... *H01L 27/0296* (2013.01); *H01L 29/0696* (2013.01); *H01L 29/7803* (2013.01); *H01L 29/7813* (2013.01); *H01L 28/20* (2013.01); *H01L 29/407* (2013.01); *H01L 29/7395* (2013.01); *H01L 29/78618* (2013.01); *H01L 29/8083* (2013.01)

(56) References Cited

U.S. PATENT DOCUMENTS

| | | |
|---|---|---|
| 2005/0035409 A1 | 2/2005 | Ko et al. |
| 2007/0126038 A1 | 6/2007 | Kobayashi |
| 2009/0039432 A1 | 2/2009 | Nishimura et al. |
| 2010/0200920 A1 | 8/2010 | Su et al. |
| 2013/0069064 A1 | 3/2013 | Yoshihira |
| 2013/0075810 A1 | 3/2013 | Hsieh |
| 2013/0343121 A1 | 12/2013 | Fukutome |
| 2015/0303117 A1 | 10/2015 | Zhu et al. |

\* cited by examiner

SEMICONDUCTOR DEVICE INCLUDING AN INTEGRATED RESISTOR AND METHOD OF PRODUCING THEREOF

BACKGROUND

Semiconductor devices based on semiconductor power transistors such as insulated gate bipolar transistors (IGBTs), or insulated gate field effect transistors (IGFETs), for example metal oxide semiconductor field effect transistors (MOSFETs) typically switch large load currents. Failure modes that may occur in these devices during operation in various applications require protective measures to prevent the semiconductor devices from damage such as excessive heat.

In order to meet with these demands, it is desirable to improve protective measures of semiconductor devices.

SUMMARY

The present disclosure relates to a semiconductor device. The semiconductor device includes a transistor device in a semiconductor die including a semiconductor body. The transistor device includes transistor cells connected in parallel and covering at least 80% of an overall active area at a first surface of the semiconductor body. The semiconductor device further includes a control terminal contact area at the first surface electrically connected to a control electrode of each of the transistor cells. A first load terminal contact area at the first surface electrically connected to a first load terminal region of each of the transistor cells. The semiconductor device further includes a resistor in the semiconductor die and electrically coupled between the control terminal contact area and the first load terminal contact area.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

Figure 1A:
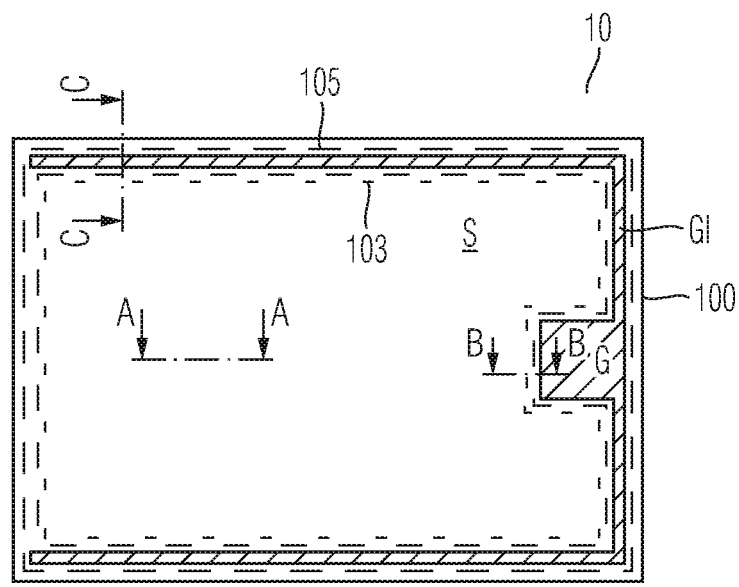
FIG. 1A depicts a schematic plan view of a semiconductor device for illustrating an embodiment of a power transistor including a resistor electrically coupled between a first load terminal and a control terminal.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

Specific embodiments described in this specification pertain to, without being limited thereto, to semiconductor devices, in particular to field effect semiconductor transistors. Within this specification the terms "semiconductor device" and "semiconductor component" are used synonymously. The semiconductor device typically includes a field-effect structure. The field-effect structure may be a MOSFET or an IGBT-structure having a pn-junction forming a body diode between a drift region of the first conductivity type and a body region of the second conductivity type. The semiconductor device is typically a vertical semiconductor device having two load metallizations, for example a source metallization and a drain metallization for a MOSFET, which are arranged opposite to each other and in low resistive contact with a respective contact region. The field-effect structure may also be formed by a JFET-structure.

By way of example, the semiconductor device is a power semiconductor device having an active area with, for example, a plurality of IGBT-cells or MOSFET-cells for carrying and/or controlling a load current between the two load metallizations. Furthermore, the power semiconductor device has typically a peripheral area with at least one edge-termination structure at least partially surrounding the active area when seen from above.

The term "field-effect" as used in this specification intends to describe the electric-field mediated formation of a conductive "channel" of a first conductivity type and/or control of conductivity and/or shape of the channel between two regions of the first conductivity type. The conductive channel may be formed and/or controlled in a semiconductor region of a second conductivity type, typically a body region of the second conductivity type, which is arranged between the two regions of the first conductivity type. Due to the field-effect, a unipolar current path through the channel region is formed and/or controlled between a source region or emitter region of the first conductivity type and a drift region of the first conductivity type in a MOSFET-structure and an IGBT-structure, respectively. The drift region may be in contact with a higher doped drain region of the first conductivity type or a higher doped collector region of the second conductivity type, respectively. The drain region or the collector region is in low resistive electric contact with a drain or collector electrode. The source region or emitter region is in low resistive electric contact with a source or emitter electrode. In a JFET-structure, the channel region is typically formed by a portion of the drift region of the first conductivity type arranged between a gate region and a body region of the second conductivity type, and may be controlled by changing the width of a depletion layer formed between the gate region and the channel region.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively.

In the context of the present specification, the term "gate electrode" intends to describe an electrode which is situated next to, and configured to form and/or control a channel region. The term "gate electrode" shall embrace an electrode or conductive region which is situated next to, and insulated from the body region by an insulating region forming a gate dielectric region and configured to form and/or control a channel region through the body region by charging to an appropriate voltage.

By way of example, the gate electrode is implemented as trench-gate electrode, i.e. as a gate electrode which is arranged in a trench extending from the main surface into the semiconductor substrate or body. The gate electrode may also be implemented as a planar gate electrode.

A transistor cell of an active area of a power semiconductor device such as a power transistor device may, in a horizontal cross-section, include a trench-gate electrode or a planar gate electrode and a surrounding portion of a mesa when the trench-gate electrodes form a two-dimensional lattice, for example in the form of a checker board, when seen from above.

Alternatively, the transistor cell of the active area of a power field-effect semiconductor device may, in a horizontal cross-section, include a trench-gate electrode or a planar gate electrode and a respective portion of two adjoining mesas when seen from above. In these embodiments, trench-gate electrodes, mesas and unit cells may form respective one-dimensional lattices.

The conductive regions for forming the gate electrode and the field electrode, respectively, may be made of a material with high enough electric conductivity so that the conductive region forms an equipotential region during device operation. For example, the conductive region may be made of a material with metallic or near-metallic electric conductivity such as a metal, for example wolfram, highly doped poly-silicon, a silicide or the like. Typically, the conductive region is in resistive electric connection with a gate metallization of the semiconductor device. The insulating region may be made of any suitable dielectric material such as silicon oxide, for example thermal silicon oxide, silicon nitride, silicon oxynitride or the like.

Figure 1B:
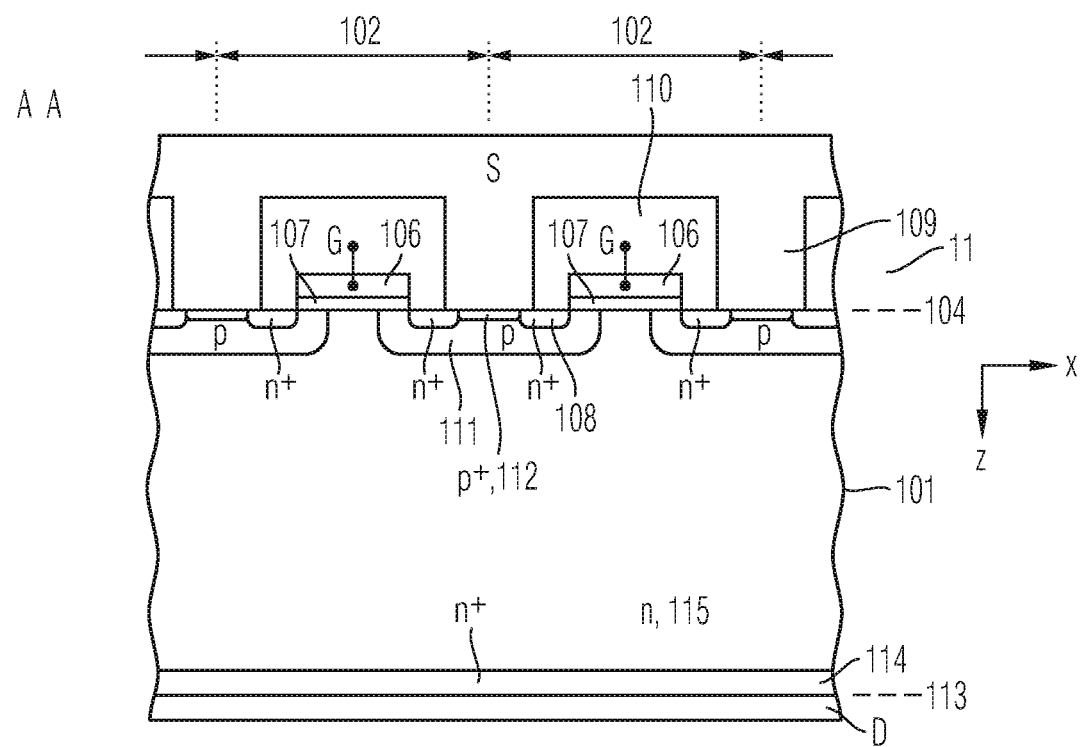
FIGS. 1B to 1D illustrate schematic cross-sectional views along cut lines AA, BB, CC of FIG. 1A, respectively, for illustrating an embodiment.
Figure 1C:
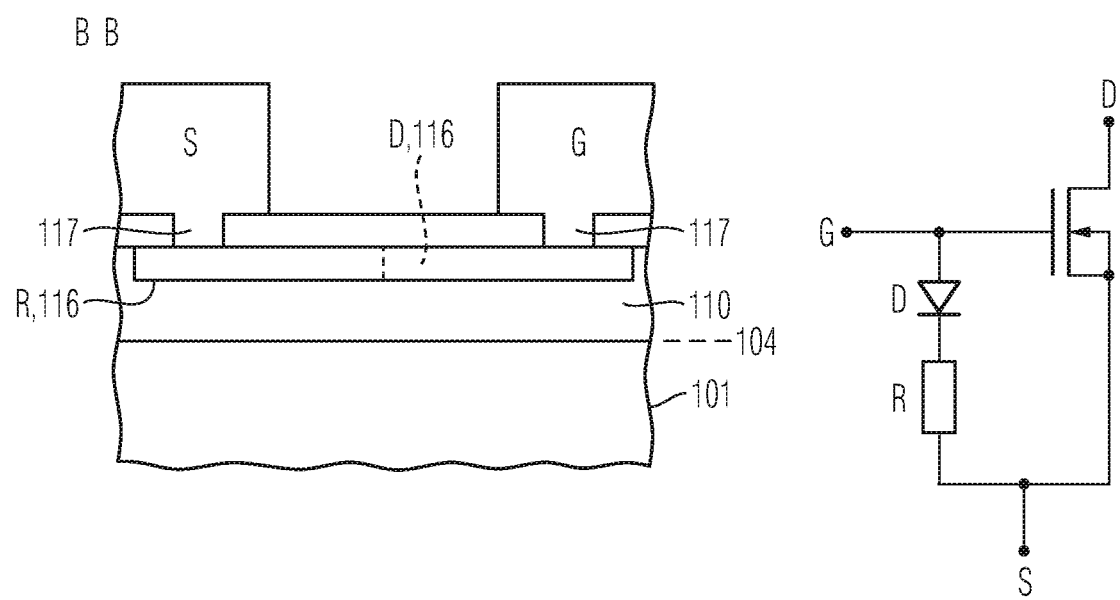
Figure 1D:
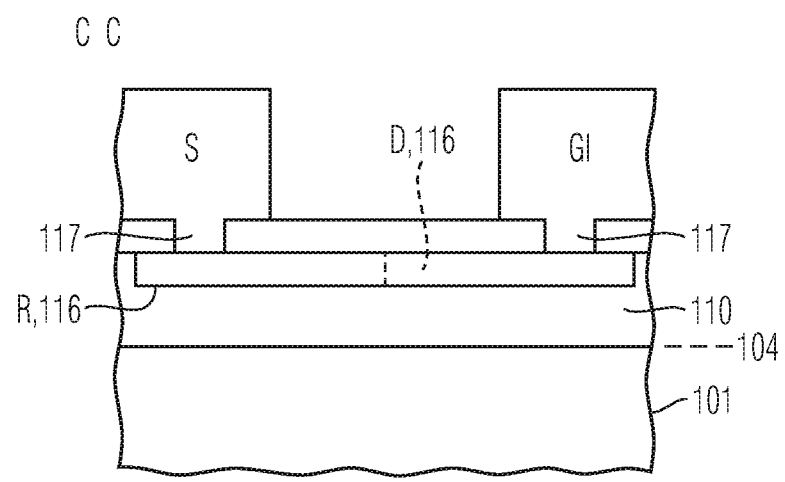

FIGS. 1A to 1D depict a schematic plan and cross-sectional views of a semiconductor device 10 for illustrating an embodiment. The cross-sectional view illustrated in FIG. 1B is taken along a cut line AA. The cross-sectional view illustrated in FIG. 1C is taken along a cut line BB. The cross-sectional view illustrated in FIG. 1D is taken along a cut line CC.

The semiconductor device 10 includes a transistor device 11 in a semiconductor die 100 including a semiconductor body 101. The transistor device 11 includes transistor cells 102 connected in parallel and covering at least 80%, for example more than 80% or more than 85% or even more than 90% of an overall active area 103 at a first surface 104 of the semiconductor body 101. An edge termination area 105 surrounds the active area 103. In the edge termination area 105, edge termination structures may be formed for lowering the electric field at the edges. Examples of edge termination structures include field plates, junction termination extension (JTE) structures, variation of lateral doping (VLD) structures, for example. In some embodiments, the transistor device 11 is a power transistor device of more than 1 A rated maximum load current and a rated load terminal to load terminal breakdown voltage larger than 10V, or larger than 12V, or larger than 15V, or larger than 20V, or larger than 24V, or larger than 30V, or larger than 100V, or larger than 300V, or larger than 600V, or larger than 1000V, or larger than several 1000V for IGBTs.

The semiconductor device 10 further includes a gate terminal contact area G at the first surface 104 electrically connected to a gate electrode 106 of each of the transistor cells 102. A gate dielectric 107 is sandwiched between the gate electrode 106 and the semiconductor body 101. The gate electrode terminal contact area G is one example of a control terminal contact area, for example. The gate electrode 106 is one example of a control electrode, for example.

The semiconductor device 10 further includes a source terminal contact area S at the first surface 104. electrically connected to an n$^+$-doped source region 108 at the first surface 104. The source terminal contact area S is one example of a first load terminal contact area. Both the gate terminal contact area G and the source terminal contact area S may be contact pads dimensioned large enough to be bonded with a wire, for example. The n$^+$-doped source region 108 is one example of a first load terminal region.

A contact 109, for example a contact plug and/or a contact line extending through an intermediate dielectric 110 electrically connects the source terminal contact area S and the n$^+$-doped source region 108 as well as the source terminal contact area S and a p-doped body region 111, for example via p$^+$-doped body contact region 112.

The semiconductor device 10 further includes a drain terminal contact area D at a second surface 113 of the semiconductor body 101 opposite to the first surface 104. The drain terminal contact area D is electrically connected to an n$^+$-doped drain region 114. The drain terminal contact area D is one example of a second load terminal contact area. The n$^+$-doped drain region 114 is one example of a second load terminal region.

The semiconductor device 10 illustrated in FIG. 1B is an example of a vertical power field effect transistor (power FET). A load current flow direction in the transistor cells 102 through an n-doped drift zone 115 is a vertical direction z perpendicular to the first and second surfaces 104, 113.

The semiconductor device 10 further includes a resistor R in a semiconductor layer 116, for example a polycrystalline silicon layer. The resistor R is electrically coupled between the gate terminal contact area G and the source terminal contact area S via contacts 117.

In some embodiments, the semiconductor layer includes a plurality of parts of different conductivity type and resistivity, for example by introducing a different amount and/or type of dopants into the parts. This allows for further integrating a diode D into the semiconductor layer 116 as is illustrated by dashed lines in FIG. 1C. In the schematic cross-sectional view of FIG. 1C, the semiconductor layer 116 extends from below the source terminal contact area S to below the gate terminal contact area G, for example.

The resistor R electrically coupled between gate terminal allows for protecting the semiconductor device against the failure mode of interruption of a gate voltage supply, for example caused by wire bond lift and/or gate pin destruction. During this failure mode, the gate may be discharged via the resistor R, thereby avoiding a non-controllable turned-on power transistor that may otherwise lead to damage of the power transistor and surrounding application components, for example due to excessive heating. In some embodiments, a resistivity of the resistor is set in a range from 50 kOhm to 150 kOhm. A turn-off time may be set by adjusting the resistivity of the resistor. By increasing the resistivity of the resistor, the turn-off time may be increased and by decreasing the resistivity of the resistor, the turn-off time may be decreased, for example.

Integration of the diode D allows for blocking current flow during a gate stress test applying a negative voltage at the gate terminal with respect to the source terminal of an n-channel FET, for example. The diode D may be formed as a polycrystalline silicon diode, for example an n$^+$/p diode, a p$^+$/n diode or an n$^+$/p$^+$ diode. Any of these diodes may be formed as a chain of sub-diodes. The number of the sub-diodes may be set with respect to blocking voltage requirements, for example.

The resistor R and/or the diode D may be integrated into the semiconductor device 10 in a variety of ways. As is illustrated in the schematic cross-sectional view of FIG. 1D along cut line CC of FIG. 1A, the semiconductor layer 116 including the resistor R and the diode D may also extend from below the source terminal contact area S to below a gate terminal interconnection line GI, for example a gate runner partly surrounding the active area for providing a low-ohmic interconnection to the gate electrodes 106 of the transistor cells 102. The semiconductor layer 116 may also include a plurality of separate parts. Sub-diodes formed in some of the separate parts may be interconnected by metal and/or any low-ohmic interconnection to form the diode D as a series-connection of sub-diodes.

The transistor cells 102 illustrated in FIG. 1B are exemplified as vertical IGFET cells. Other embodiments may include vertical IGFET cells that differ from the design illustrated in FIG. 1B in structural features, for example with respect to a design of the source and body regions 111, 108 and their contact scheme. Further embodiments may include trench gate structures instead of the planar gate structures illustrated in FIG. 1A.

Figure 2A:
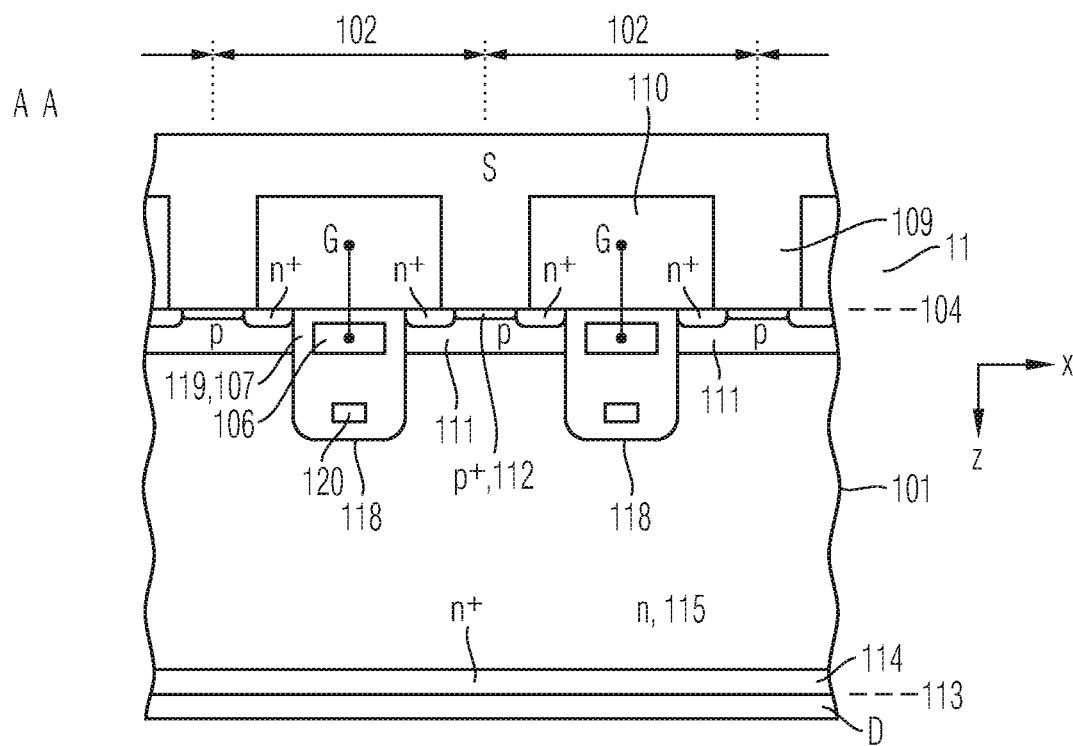
FIGS. 2A to 2C illustrate schematic illustrate schematic cross-sectional views along cut lines AA, BB, CC of FIG. 1, respectively, for illustrating an embodiment.

Transistor cells 102 including trench gate structures are illustrated in the schematic cross-sectional view of FIG. 2A along cut line AA of FIG. 1A. The gate electrode 106 and the gate dielectric 107 are arranged in a trench 118 extending into the semiconductor body 101 from the first surface 104. The gate dielectric 107 is part of a dielectric structure 119 in the trench 118. The dielectric structure 119 may further provide electric insulation between the gate electrode 107 and one or more optional field electrodes in the trench 118. In the embodiment illustrated in FIG. 2A, the one or more field electrodes are exemplified by a field electrode 120 arranged below the gate electrode 106.

In some embodiments, a forward voltage VF of the diode D at a forward current in a range of 1 mA and 10 mA is smaller than a threshold voltage of the transistor device 11 at the same current level.

Figure 2B:
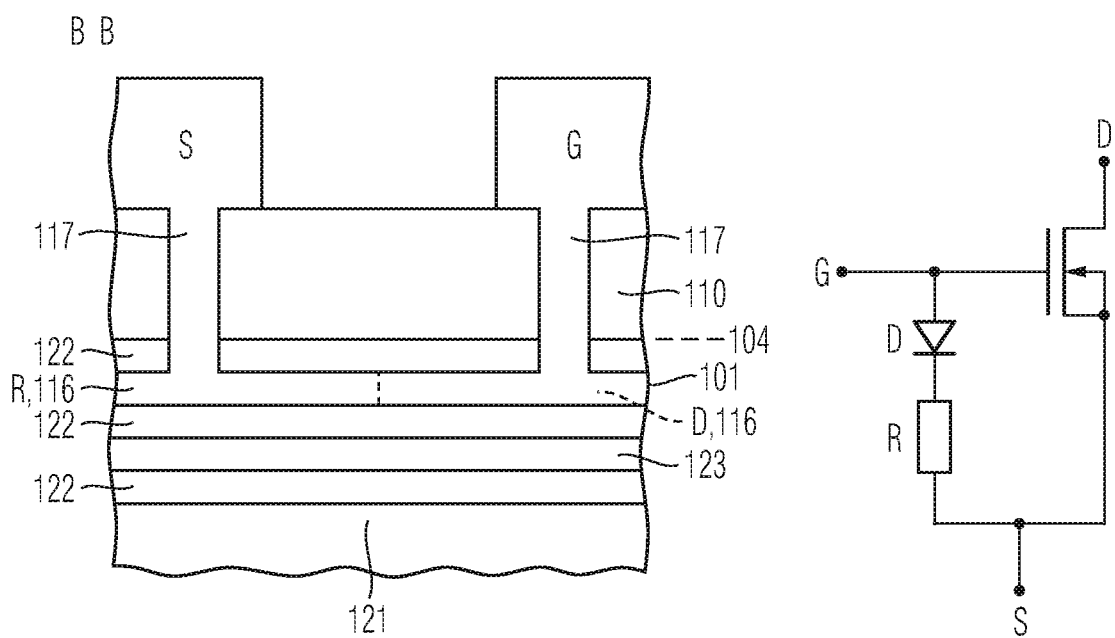

As is illustrated in the schematic cross-sectional view of FIG. 2B along cut line BB of FIG. 1A, the semiconductor layer 116 including the resistor R and the diode D is arranged in a trench 121 and extends from below the source terminal contact area S to below the gate terminal contact area G. A dielectric structure 122 in the trench 121 electrically insulates the semiconductor layer 116 including the resistor R and the diode D from a surrounding part of the semiconductor body 101 and from one or more optional additional semiconductor layers in the trench 121. In the embodiment illustrated in FIG. 2B, the one or more additional semiconductor layers are exemplified by an additional semiconductor layer 123. The dielectric structure 119 of FIG. 2A and the dielectric structure 122 of FIG. 2B may be processed together, for example by dielectric growth or deposition processes such as thermal oxidation and chemical vapor deposition techniques, for example. Likewise, the gate electrode 106 illustrated in FIG. 2A and the semiconductor layer 116 in the trench 121 of FIG. 2B may be processed together, for example by a polycrystalline silicon deposition process. When adjusting conductivity type and resistivity of the gate electrode 106 and the semiconductor layer 116, different doping processes may be applied, for example. Similar to joint processing of the dielectric structures 119, 122 or the gate electrode 106/the semiconductor layer 116, joint processing may also be carried out with respect to the trenches 118, 121 or the field electrode 120/additional semiconductor layer 123, or the contacts 109, 117.

Figure 2C:
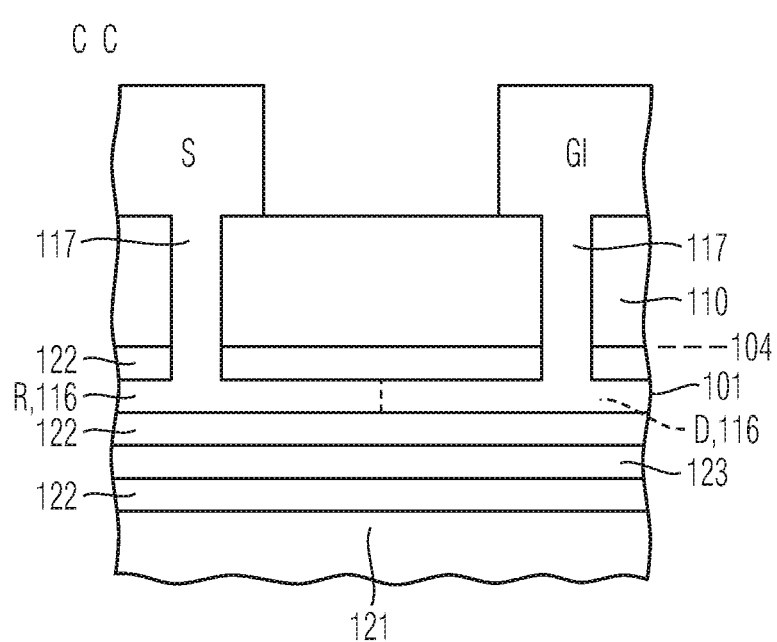

As is illustrated in the schematic cross-sectional view of FIG. 2C along cut line CC of FIG. 1A, the semiconductor layer 116 including the resistor R and the diode D in the trench 121 may also extend from below the source terminal contact area S to below the gate terminal interconnection line GI, for example a gate runner partly surrounding the active area 103 for providing a low-ohmic interconnection to the gate electrodes 106 of the transistor cells 102.

Figure 3:
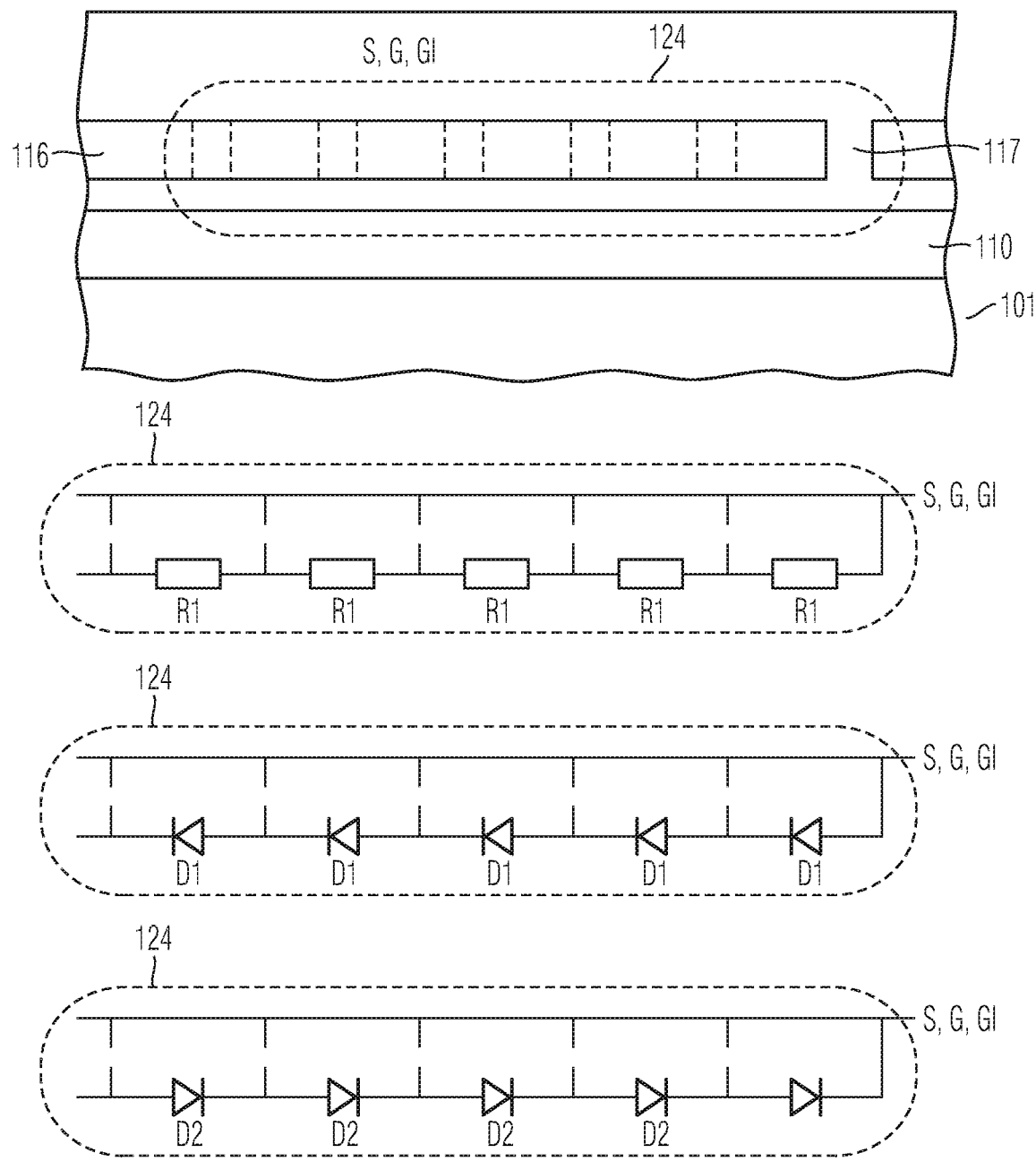
FIG. 3 depicts a schematic cross-sectional view of a semiconductor device for illustrating a flexible adjustment of a resistance value of a resistor and a blocking voltage capability of a diode according to an embodiment.

Referring to the schematic cross-sectional view of the semiconductor body 101 depicted in FIG. 3, the semiconductor layer 116 including the resistor and/or the diode D partly extends below the source terminal contact area S and/or the gate terminal contact area G and/or the gate terminal interconnection line GI and is electrically connected to a respective one of the source terminal contact area S, the gate terminal contact area G, or the gate terminal interconnection line GI by the contact 117. A flexible adjustment of a resistance value of the resistor R and/or a blocking voltage capability/breakdown voltage of the diode D may be achieved by placing the contact 117 at different locations along an extension of the semiconductor layer in an extension area 124 (see dashed lines in FIG. 3 for displaced contact 117). As is illustrated in the schematic circuit diagrams for the areas 124, the resistor R may include a flexible serial connection of sub-resistors R1, and the diode D may include a flexible serial connection of sub-diodes D1, D2, thereby achieving a flexible adjustment of the resistance value and the blocking voltage capability. Sub-elements R1, D1, D2 of the resistor R and the diode D may be serially connected in a flexible way.

In some embodiments, for example the embodiment illustrated in FIGS. 1A to 1D, the semiconductor device comprises a single metal wiring level, the control terminal contact area, for example the source terminal contact area S and the first load terminal contact area, for example the gate terminal contact area G being different parts of the single metal wiring level. The single wiring level that may be formed of a patterned metallization layer or a patterned metallization layer stack may thus be the only metal wiring level above the first surface 104.

Figure 4:
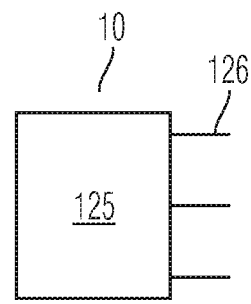
FIG. 4 is a schematic illustration of the semiconductor device illustrated in FIG. 1 being a three terminal device.

In some embodiments, for example as is illustrated in FIG. 4, the semiconductor device 10 is a three-terminal device including a semiconductor die in a package 125 having three pins, the three pins 126 being electrically connected to first and second load terminals contact areas S, D and the control terminal area G of the transistor device. In some other embodiments, the package 125 may include more than three pins, the other pins being also connected to one or more of the first and second load terminals contact areas S, D and the control terminal area G. The package 125 may be a lead frame based package or a substrate based package, for example based on Through Hole Technology (THT) or Surface Mounted Device (SMD), for example.

The semiconductor device may lack any supply voltage terminals or -pins.

Figure 5:
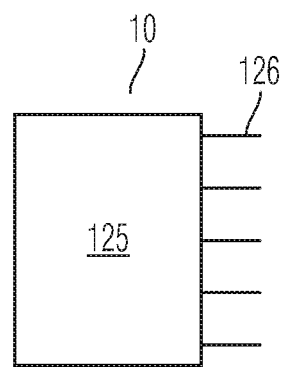
FIG. 5 is a schematic illustration of the semiconductor device illustrated in FIG. 1 being a five terminal device.

In some embodiments, for example as is illustrated in FIG. 5, the semiconductor device 10 is a five-terminal device including a semiconductor die in a package 125 having five pins, the five pins being electrically connected to first and second load terminals contact areas S, D, first and second load sense terminals and the control terminal area G of the transistor device. In some other embodiments, the package 125 may include more than five pins, the other pins being also connected to one or more of the first and second load terminals contact areas S, D, the first and second load sense terminals and the control terminal area G.

In some embodiments, the term semiconductor device 10 is a power semiconductor device with high voltage and/or high current switching capabilities, for example more than 1 A rated maximum load current and a rated load terminal to load terminal breakdown voltage in a range from 10V to 1000V.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a transistor device in a semiconductor die including a semiconductor body, the transistor device comprising transistor cells connected in parallel and covering at least 80% of an overall active area at a first surface of the semiconductor body;
   a control terminal contact area at the first surface and electrically connected to a control electrode of each of the transistor cells;
   a first load terminal contact area at the first surface and electrically connected to a first load terminal region of each of the transistor cells;
   a resistor in the semiconductor die and electrically coupled between the control terminal contact area and the first load terminal contact area, wherein a current path from the control terminal contact area via the resistor to the first load terminal contact area is configured to discharge a gate of the transistor device at a failure mode of interruption of gate voltage supply; and
a pn junction diode in the semiconductor die and electrically connected in series with the resistor,
wherein at least one of the resistor and the pn junction diode laterally extends below the first load terminal contact area,
wherein the resistor is electrically connected to the first load terminal contact area via a contact.

2. The semiconductor device of claim 1, wherein the pn junction diode and the resistor are included in a same semiconductor layer.

3. The semiconductor device of claim 2, wherein the semiconductor layer extends from below the first load terminal contact area to below the control terminal contact area.

4. The semiconductor device of claim 2, wherein the semiconductor layer extends from below the first load terminal contact area to below a control terminal interconnection line.

5. The semiconductor device of claim 4, wherein the control terminal interconnection line includes a gate runner partly surrounding the active area, and wherein the semiconductor layer extends from below the first load terminal contact area to below the gate runner.

6. The semiconductor device of claim 2, wherein the semiconductor layer is arranged in a trench which extends from below the first load terminal contact area to below the control terminal contact area.

7. The semiconductor device of claim 6, wherein a dielectric structure in the trench electrically insulates the semiconductor layer including the resistor and the pn junction diode from a surrounding part of the semiconductor body.

8. The semiconductor device of claim 2, wherein the semiconductor layer extends below the first load terminal contact area and/or the control terminal contact area and/or a control terminal interconnection line, and wherein the semiconductor layer is electrically connected to a respective one of the first load terminal contact area, the control terminal contact area, or the control terminal interconnection line by the contact.

9. The semiconductor device of claim 2, wherein the resistor includes a serial connection of sub-resistors, wherein the pn junction diode includes a serial connection of sub-diodes, and wherein a location of the contact along an extension of the semiconductor layer in an extension area determines a resistance value of the resistor and a blocking voltage capability of the pn junction diode.

10. The semiconductor device of claim 1, wherein the active area is surrounded by an edge termination area.

11. The semiconductor device of claim 1, further comprising a second load terminal contact area at a second surface opposite to the first surface.

12. A method of producing a semiconductor device, the method comprising:
forming a transistor device in a semiconductor die including a semiconductor body, the transistor device comprising transistor cells connected in parallel and covering at least 80% of an overall active area at a first surface of the semiconductor body;
forming a control terminal contact area at the first surface and electrically connected to a control electrode of each of the transistor cells;
forming a first load terminal contact area at the first surface and electrically connected to a first load terminal region of each of the transistor cells;
forming a resistor in the semiconductor die and electrically coupled between the control terminal contact area and the first load terminal contact area, wherein a current path from the control terminal contact area via the resistor to the first load terminal contact area is configured to discharge a gate of the transistor device at a failure mode of interruption of gate voltage supply; and
forming a pn junction diode electrically connected in series with the resistor,
wherein at least one of the resistor and the pn junction diode laterally extends below the first load terminal contact area,
wherein the resistor is electrically connected to the first load terminal contact area via a contact.

13. The method of claim 12, wherein forming the pn junction diode comprises forming the pn junction diode in a same semiconductor layer as the resistor.

14. The method of claim 13, wherein the semiconductor layer extends from below the first load terminal contact area to below the control terminal contact area.

15. The method of claim 13, wherein the semiconductor layer extends from below the first load terminal contact area to below a control terminal interconnection line.

16. The method of claim 15, wherein the control terminal interconnection line includes a gate runner partly surrounding the active area, and wherein the semiconductor layer extends from below the first load terminal contact area to below the gate runner.

17. The method of claim 13, wherein forming the pn junction diode in the same semiconductor layer as the resistor comprises arranging the semiconductor layer in a trench that extends from below the first load terminal contact area to below the control terminal contact area.

18. The method of claim 17, further comprising:
forming a dielectric structure in the trench and which electrically insulates the semiconductor layer including the resistor and the pn junction diode from a surrounding part of the semiconductor body.

19. The method of claim 13, wherein the semiconductor layer extends below the first load terminal contact area and/or the control terminal contact area, the method further comprising:
electrically connecting the semiconductor layer to a respective one of the first load terminal contact area or the control terminal contact area by the contact.

20. The method of claim 13, wherein forming the resistor comprises forming a serial connection of sub-resistors, wherein forming the pn junction diode comprises forming a serial connection of sub-diodes, the method further comprising:
selecting a location of the contact along an extension of the semiconductor layer in an extension area to determine a resistance value of the resistor and a blocking voltage capability of the pn junction diode.

* * * * *